(12) United States Patent  
Aggarwal et al.

(10) Patent No.: US 9,148,155 B1  
(45) Date of Patent: Sep. 29, 2015

(54) CLOCK DISTRIBUTION ARCHITECTURE FOR INTEGRATED CIRCUIT

(71) Applicants: Amit Aggarwal, Ghaziabad (IN); Himanshu Goel, Ghaziabad (IN); Ashish Malhotra, Noida (IN); Ankit Pal, Greater Noida (IN)

(72) Inventors: Amit Aggarwal, Ghaziabad (IN); Himanshu Goel, Ghaziabad (IN); Ashish Malhotra, Noida (IN); Ankit Pal, Greater Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 1 day.

(21) Appl. No.: 14/248,332

(22) Filed: Apr. 8, 2014

(51) Int. Cl.  
*H03L 7/08* (2006.01)  
*H03K 3/017* (2006.01)

(52) U.S. Cl.  
CPC . *H03L 7/08* (2013.01); *H03K 3/017* (2013.01)

(58) Field of Classification Search  
CPC ............... H03L 7/06; H03L 7/07; H03L 7/08; H03L 7/0814; H03L 7/113  
USPC ........... 327/156, 158, 161; 375/371, 375, 376  
See application file for complete search history.

(56) References Cited

U.S. PATENT DOCUMENTS

| 7,366,270 | B2 | 4/2008 | Tang |
| 8,239,704 | B2 | 8/2012 | Scott |
| 8,275,025 | B2 | 9/2012 | Abel |
| 2006/0006918 | A1* | 1/2006 | Saint-Laurent ............... 327/295 |
| 2012/0319750 | A1 | 12/2012 | Zhu |

* cited by examiner

*Primary Examiner* — John Poos  
(74) *Attorney, Agent, or Firm* — Charles Bergere

(57) ABSTRACT

An integrated circuit (IC) includes multiple circuit modules that have specific clocking requirements, multiple clock sources (e.g., PLLs, duty cycle re-shaper, etc.), and at least one clock input port. The clock sources have specific clock source specifications, and the circuit modules have specific clocking requirements. The clock sources are selected based on an identification of the most common clocking requirements, and then placed at routing distances measured from the input port that are less than corresponding predetermined maximum routing distances such that the clocking requirements of the circuit modules are met. The IC thus generates clock signals internally, rather than externally.

13 Claims, 2 Drawing Sheets

CLOCK DISTRIBUTION ARCHITECTURE FOR INTEGRATED CIRCUIT

BACKGROUND OF THE INVENTION

The present invention relates generally to integrated circuits (ICs), and, more particularly, to a system with a reduced number of external clock sources.

Integrated circuits usually include many circuit modules such as data converters, processors, memory arrays, and various combinational logic circuits, as well as interface circuitry. Examples of interfaces include universal serial bus (USB), double data rate (DDR), peripheral component interconnect express (PCIe), media independent interface (MII), and serial advanced technology attachment (SATA). The circuit modules exchange data using these interfaces. Thus, data and control signals are transferred among the circuit modules and interfaces within the IC. The IC requires clock signals to regulate and synchronize the flow of the data and control signals. A clock generator receives a reference clock signal from a crystal oscillator and generates multiple clock signals that are further distributed inside the IC. The characteristics of a clock generator are determined by signaling method, performance parameters, input voltage and frequency, and output voltage and frequency of the clock signals. The clock generator may use single-ended or differential signaling methods to generate the clock signals. The performance parameters of the clock generator include jitter, propagation delay, duty cycle, and output skew of the clock signals. Various circuit modules and interfaces have different clock signal requirements and hence require clock generators with different characteristics.

For example, a USB module requires a 480 megahertz (MHz) single-ended reference clock signal that is at a voltage of 1.8 volts (V) while a PCIe module requires a 5,000 MHz differential reference clock signal that is at a voltage of 1V. Thus, two separate clock generators are required. With an increase in the number of circuit modules and interfaces with various clock signal requirements, the number of clock generators increases. The multiple clock generators or clock oscillators are external to the IC, which increases the bill of materials (BOM) cost as well as require increased circuit board area. This is especially true for low cost, low performance systems. Having multiple off-chip clock generators also requires fixed clock ports on the IC. If a circuit module is placed at one side of the IC and the clock port is located at the opposite side, then the circuit modules through which the clock signal must traverse to reach its destination will introduce jitter and propagation delay in the clock signal. Thus, the overall performance of the circuit module and in turn that of the system is hampered.

Certain systems include a physical interface (PHY) chip that is placed on the circuit board (off-chip). The PHY chip includes a clock generation module that generates a clock signal that is used to synchronize the exchange of data and control signals of the IC, including memory clock signals, address and command signals, output data signals, etc. In certain cases, the clock signal requirements of the circuit modules and interfaces in the IC do not match the clock signal specifications of the clock signal generated by the PHY chip. As a result, the clock signal generated by the PHY chip may not be used.

Certain other systems include clock generators, such as PLLs that are used for clock generation. The PLLs have certain clock signal specifications. The circuit modules and interfaces that have clock signal requirements that match the clock signal specifications of the PLL are associated with the corresponding PLL. Thus, as the number of PLLs corresponding to the large number of the circuit modules and interfaces increases, the cost and area of the IC also increase.

Therefore, it would be advantageous to have a system that employs fewer clock generators, selects a location of a clock port based on a routing distance of a clock signal, uses clock signals generated by PHY chips, and reduces the BOM cost and area of the system, or otherwise addresses some or all of the above-mentioned limitations.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE PRESENT INVENTION

Figure 1:
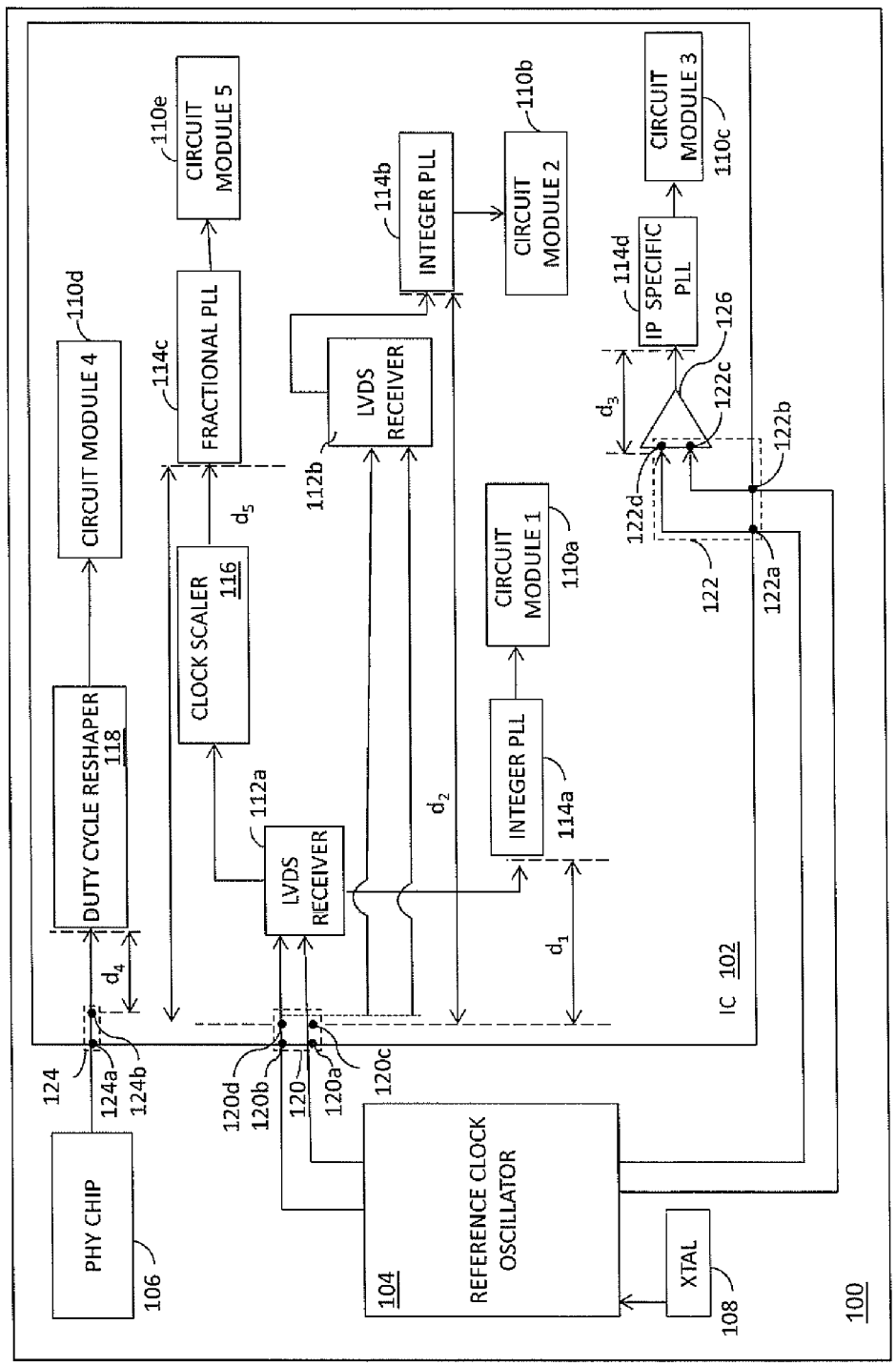
FIG. 1 is a schematic block diagram of a clock distribution architecture of an integrated circuit (IC) in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an IC having a plurality of phase-locked loops (PLLs) connected to a common input port is provided. The IC includes a first input port, first and second PLLs, and first and second circuit modules. The first input port receives a first external reference clock signal, and provides this clock signal to the first and second PLLs. The first and second PLLs receive the first external reference clock signal and generate first and second clock signals, respectively, which are required by the first and second circuit modules of the IC. The first and second PLLs are located at respective first and second routing distances from the first input port. The first and second routing distances are less than first and second predetermined maximum routing distances. Thus, the clock signals required by the internal circuit modules of the IC are generated on-chip. Further, only one clock port is required.

In another embodiment of the present invention, an IC having a plurality of phase-locked loops (PLLs) connected to a common input port is provided. The IC includes first through third input ports, first and second low-voltage differential signaling (LVDS) receivers, first through third phase-locked loops (PLLs), first through fifth circuit modules, and a duty cycle re-shaper. The first input port receives a first external differential reference clock signal. The first and second LVDS receivers are connected to the first input port and receive the first external differential reference clock signal and generate first and second single-ended clock signals, respectively. The first PLL is connected to the first LVDS receiver, has a first clock source specification, and receives the first single-ended clock signal and generates a first clock signal. The second PLL is connected to the second LVDS receiver, has a second clock source specification, and receives the first single-ended clock signal and generates a second clock signal. The first circuit module is connected to the first PLL, has a first clock source requirement, and receives the first clock signal. The second circuit module is connected to the second PLL, has a second clock source requirement different from the first clock source requirement, and receives the second clock signal. The first and second PLLs are located at first and second routing distances from the first input port, respectively. The first and second routing distances are less than first and second predetermined maximum routing distances. The second input port receives the first external differential reference clock signal. The third PLL is connected to the second input port and has a third clock source specification. The third PLL receives the first external differential reference clock signal and generates a third clock signal. The third circuit module is connected to the third PLL, has a third clock source requirement different from the first and second clock source requirements, and receives the third clock signal. The third PLL is at a third routing distance from the second input port. The third routing distance is less than a third predetermined maximum routing distance and a routing distance between the first input port and the third PLL is greater than the third predetermined maximum routing distance. The third input port receives a second external reference clock signal that has a first duty cycle. The duty cycle re-shaper is connected to the third input port at a fourth routing distance from the third input port. The duty cycle re-shaper receives the second external reference clock signal and generates a fourth clock signal having a second duty cycle. The fourth circuit module has a fourth clock source requirement different from the first, second, and third clock source requirements and receives the fourth clock signal, such that the fourth clock source requirement is met. The first, second, third, and fourth clock source requirements each include at least one of a frequency requirement, a jitter requirement, a voltage swing requirement, and a duty cycle requirement of the first, second, third, and fourth circuit modules, respectively.

In yet another embodiment of the present invention, a method for designing an IC is provided. The IC includes at least one clock input port, first and second low-voltage differential signaling (LVDS) receivers, first through third phase-locked loops (PLLs), first through fourth circuit modules, and a duty cycle re-shaper. The method includes identifying a plurality of clock sources required by the circuit modules. The clock sources have clock source specifications. The clock sources are placed in the IC such that the routing distance from the clock port to the clock source is less than a predetermined maximum routing distance. Then the clock sources are connected to the respective circuit modules. Thus, the clock source specifications are met during placement and the clocking requirements of the circuit modules are met by obtaining their clock signals from the appropriate clock sources. Various embodiments of the present invention provide an IC that includes first through third input ports, first and second low-voltage differential signaling (LVDS) receivers, first through third phase-locked loops (PLLs), first through fourth circuit modules, and a duty cycle re-shaper. A first external reference clock signal is received at the first through third PLLs. The first through third PLLs generate first through third clock signals, respectively. The first, second, and third clock signals meet clock source requirements of the first through third circuit modules connected to the first through third PLLs, respectively, as the first through third PLLs are placed at routing distances less than first, second, and third predetermined maximum routing distances. A second external reference clock signal is received at the duty cycle re-shaper by way of the third input port. Thus, the fourth circuit module that has a fourth clock source requirement receives a fourth clock signal generated by the duty cycle re-shaper, and the fourth clock source requirement is met. A reference clock oscillator and the first through third PLLs are selected by identifying commonest clock source specifications of the first through third PLLs and the clock source requirements of the first through fourth circuit modules, respectively. Thus, the number of clock sources used in the IC is reduced. Consequently, the BOM cost and area of a system using the IC are also reduced. The third PLL is placed at a routing distance greater than the third predetermined maximum routing distance from the first input port. Hence, a second input port is selected such that the third PLL is placed at a routing distance less than the third predetermined maximum routing distance from the second input port. Thus, the third PLL receives the first external reference clock signal by way of the second input port. As a result, the first external reference clock signal is routed by way of a clock signal path that is external to the IC. Thus, the first reference clock signal received at the second input port is less jittery and has minimum propagation delay, leading to an overall improved performance of the IC. In an embodiment of the present invention, the second external reference clock signal is generated by a PHY chip. Thus, the second external reference clock signal is utilized by the circuit modules of the IC and not unused as compared to the conventional ICs with multiple clock sources.

Referring now to FIG. 1, a schematic block diagram of a clock distribution architecture 100 of an IC 102, in accordance with an embodiment of the present invention, is shown. The clock distribution architecture 100 includes the IC 102, a reference clock oscillator 104, a physical interface (PHY) chip 106, and a crystal 108. The IC 102 includes first through fifth circuit modules 110a-110e (collectively referred to as circuit modules 110), first and second LVDS receivers 112a and 112b, first through fourth PLLs 114a-114d (collectively referred to as PLLs 114), a clock scaler circuit 116, a duty cycle re-shaper 118, first through third input ports 120, 122 and 124, and an on-chip termination module 126.

The first input port 120 illustrates the board to chip or die connections such as controlled collapse chip carrier connections (C5 balls) 120a and 120b and controlled collapse chip connections (C4 pins) 120c and 120d. The second input port 122 illustrates board to chip connections such as C5 balls 122a and 122b and C4 pins 122c and 122d. The C4 pins 122c and 122d are connected to the on-die termination module 126. Likewise, the C4 pins 120c and 120d may be connected to an on-die termination module (not shown). The on-die termination module 126 provides impedance matching with the reference clock oscillator 104. The third input port 124 also illustrates board to chip connections such as a C5 ball 124a and C4 pin 124b.

The reference clock oscillator 104 uses the vibrations of the crystal 108 to generate a reference clock signal, as is known by those of skill in the art. In an embodiment of the present invention, the reference clock oscillator 104 generates a differential reference clock signal. The differential reference clock signal has a predetermined frequency, a jitter specification, and a duty cycle. The reference clock oscillator 104 outputs a differential reference clock signal that is provided to the IC 102 at the first and second input ports 120 and 122. The LVDS receivers 112a and 112b are connected to the first input port 120 and receive the differential reference clock signal. The LVDS receivers 112a and 112b convert the differential reference clock signal to a single-ended clock signal.

The single-ended clock signal is then routed and distributed to the PLLs 114a-114c and the circuit modules 110a, 110b, and 110e. It will be apparent to those of skill in art that if clock source specifications and requirements of the PLLs 114 and the circuit modules 110, respectively, include single-ended reference clock signals, the reference clock oscillator 104 may generate a single-ended reference clock signal. In this case, the LVDS receivers 112a and 112b would be unnecessary.

There are clock source specifications and clock source requirements associated with the PLLs 114a-114d and the circuit modules 110, respectively, and the clock source requirements of each of the circuit modules 110 may be different from each other. The clock source specifications and requirements include frequency, jitter, voltage swing, and duty cycle requirements. The PLLs 114a-114d are placed in the IC 102 at routing distances measured from the input ports 120 and 122 such that the routing distances are less than first, second, third, and fourth predetermined maximum routing distances $d_{max1}$, $d_{max2}$, $d_{max3}$, and $d_{max4}$, respectively (referred to as predetermined maximum routing distance $d_{max}$). Each PLL 114 has its own predetermined maximum routing distance $d_{max}$ that is determined based on the circuit modules 110 in a clock signal path of each PLL 114 from the input ports 120 and 122, the clock source specifications of each PLL 114, the routing distance of each PLL 114 from the input ports 120 and 122, and the clock source specifications required at the input ports 120 and 122. The routing distance determines whether the clock source specifications of the PLLs 114 and requirements of the circuit modules 110 are met. The predetermined maximum routing distance $d_{max}$ is the maximum routing distance of each PLL 114 from the input port to which it is connected. If a PLL 114 is placed beyond its predetermined maximum routing distance $d_{max}$, then the clock source specification for that PLL are not met, as more jitter and delay will be introduced in the differential reference or single-ended clock signals routed thereto.

PLL 114a, which is an integer PLL, is connected to the LVDS receiver 112a and placed at a routing distance $d_1$ from port 120. As the routing distance $d_1$ is less than the first predetermined maximum routing distance $d_{max1}$, the PLL 114a receives the single-ended clock signal, and the clock source specification of PLL 114a is met. PLL 114a generates and transmits a first clock signal to the circuit module 110a. PLL 114a is selected to be connected to circuit module 110a by identifying the clock signal requirement of the circuit module 110a and the routing distance $d_1$. That is, the use of PLL 114a satisfies the clock source requirement of circuit module 110a. The LVDS receiver 112a is also connected to the clock scaler circuit 116. The clock scaler circuit 116 receives the single-ended reference clock signal and generates a scaled clock signal. The clock scaler circuit 116 is connected to the PLL 114c, which is a fractional PLL. PLL 114c has a routing distance $d_5$ from the input port 120. As the routing distance $d_5$ is less than the predetermined maximum routing distance $d_{max3}$, then PLL 114c receives the scaled clock signal, and the clock source specification of PLL 114c is met. PLL 114c generates and transmits a third clock signal to the circuit module 110e. As the PLL 114c is selected by identifying the clock source requirement of the electronic component 110e and is placed at the routing distance $d_5$, the third clock signal meets the clock source requirement thereof. It will be apparent to those of skill in art that the clock scaler circuit 116 may be implemented as a clock multiplier circuit or a clock divider circuit.

The PLL 114b, which is an integer PLL, is connected to the LVDS receiver 112b and located has a routing distance $d_2$. As the routing distance $d_2$ is less than the second predetermined maximum routing distance $d_{max2}$, the PLL 114b receives the single-ended clock signal, and the clock source specification of the PLL 114b is met. The PLL 114b generates and transmits a second clock signal to the circuit module 110b. As the PLL 114b is selected by identifying the clock source requirement of the circuit module 110b and is placed at the routing distance $d_2 < d_{max2}$, then the second clock signal meets the clock source requirement thereof. It will be apparent to those skilled in the art that the PLLs 114a and 114b may be fractional PLLs and the PLL 114c may be an integer PLL.

PLL 114d is an IP specific PLL, such as a serializer/deserializer (SERDES) PLL, and is connected to the second input port 122 and placed at a routing distance $d_3$ from the second input port 122. As the routing distance $d_3$ is less than the fourth predetermined maximum routing distance $d_{max4}$, the PLL 114d receives the differential reference clock signal, and the clock source specification of the PLL 114d is met. The PLL 114d generates and transmits a fourth clock signal to the circuit module 110c. As the PLL 114d is selected by identifying the clock source requirement of the circuit module 110c and has a routing distance $d_3 < d_{max4}$, the fourth clock signal meets the clock source requirement of the circuit module 110c. The differential reference clock signal is routed to the second input port 122 via an off-chip clock signal path. On-board routing of the differential reference clock signal makes the differential reference clock signal less jittery and less susceptible to noise as compared to on-chip routing.

The PHY chip 106 is connected to the third input port 124. The PHY chip 106 generates a fifth clock signal having a first duty cycle. The duty cycle re-shaper 118 is connected to the third input port 124 and is placed at a routing distance $d_4$ from the port 124. The duty cycle re-shaper 118 receives the fifth clock signal and generates a sixth clock signal having a second duty cycle. The circuit module 110d, connected to the duty cycle re-shaper 118, receives the sixth clock signal and a duty cycle requirement thereof is met. It should be noted that the routing distances $d_1$, $d_2$, $d_3$, $d_4$, and $d_5$ are shown in FIG. 1 to indicate the linear distances between the first through third input ports 120-124 and the PLLs 114 for illustrative purpose only. It is to be understood that the actual distances equal distances of the clock signal paths between the first through third input ports 120-124 and the PLLs 114.

Generally, according to the present invention, each of the various circuit modules of the IC 102 are defined along with the clocking requirements for the circuit modules. Then a clock signal from an external port is routed to the circuit modules and checks are made to determine that the distance from the clock port to the various circuit modules are less than a predetermined maximum routing distance. PLLs such as an integer PLL, fractional PLL, etc., as previously discussed, then are used to create the specific clock signals required by each of the circuit modules. In this way, the clock signals required by the IC are generated on-chip, as opposed to on a PCB on which the IC is mounted. This saves board space and BOM cost.

Figure 2:
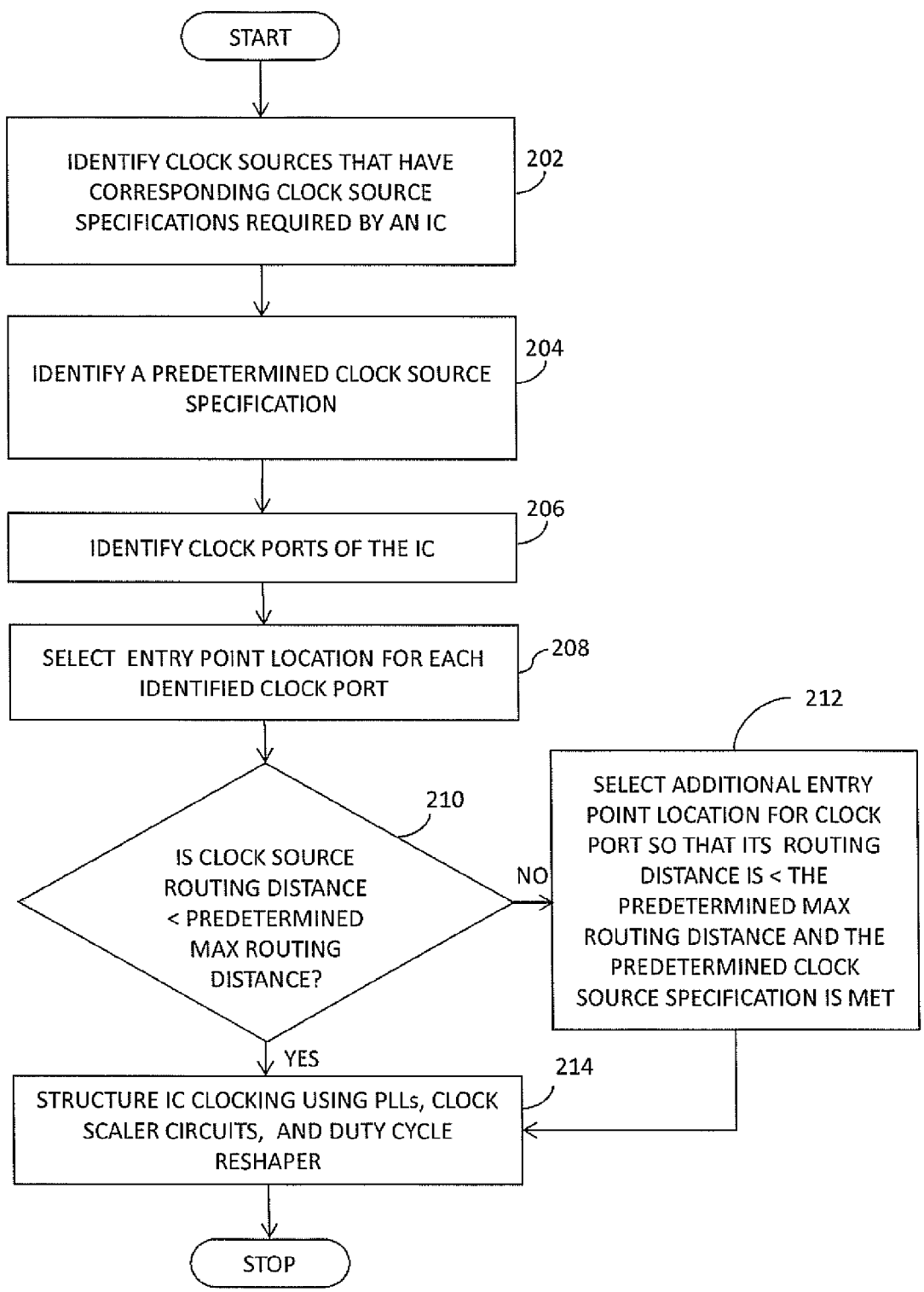
FIG. 2 is a flow chart illustrating a method of designing the IC of FIG. 1, in accordance with an embodiment of the present invention.

Referring now to FIG. 2, a flow chart of a method for designing the IC 102 of FIG. 1, in accordance with an embodiment of the present invention, is shown. At step 202, clock sources that have corresponding clock source specifications, which are required by the IC 102, are identified using an electronic design automation (EDA) tool that includes a memory for storing an initial integrated circuit design and a processor in communication with the memory (not shown). The processor and memory comprise a computer system that can range from a stand-alone personal computer to a network of processors and memories, to a mainframe system. The computer system must be able to run verification tools that can simulate digital and analog circuits, such as Incisive™ Unified Simulator (IUS) by Cadence Design Systems, Inc. Such tools and computer systems are known to those of skill in the art.

At step 204, at least one predetermined clock source specification of the clock source specifications is identified. At step 206, clock ports of the IC 102 are identified. At step 208, a location of an entry point for each identified clock port on the IC 102 is selected. At step 210, a check is performed to determine whether a clock source is placed at a routing distance less than a predetermined maximum routing distance $d_{max}$ from the clock port. If it is determined at step 210 that the clock source is not placed at a routing distance less than the predetermined maximum routing distance $d_{max}$, at step 212, an additional location of an entry point for a clock port is chosen such that a routing distance of the clock source is less than the predetermined maximum routing distance $d_{max}$ from the clock port and the at least one predetermined clock source specification is met. However, if at step 210, it is determined that the clock source is placed at a routing distance less than the predetermined maximum routing distance $d_{max}$, then at step 214, clocking for the circuit modules is structured using PLLs, clock scaler circuits, and duty cycle re-shapers, as previously discussed. In various embodiments of the present invention, steps 202-214 are performed using the processor of the EDA tool or manually by a designer.

Thus, the initial IC design is modified by executing steps 202-214. The modified IC design is used to fabricate the IC 102 using known processes (i.e., the necessary design data files are sent to a fabrication facility wherein the IC is fabricated on a semiconductor wafer).

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An integrated circuit having a plurality of phase-locked loops (PLLs) connected to a common input port, the integrated circuit, comprising:
    a first input port that receives a first external reference clock signal;
    a first PLL, connected to the first input port and having a first clock source specification, that receives the first external reference clock signal and generates a first clock signal;
    a second PLL, connected to the first input port and having a second clock source specification, that receives the first external reference clock signal and generates a second clock signal;
    a first circuit module connected to the first PLL and having a first clock source requirement, wherein the first circuit module receives the first clock signal; and
    a second circuit module connected to the second PLL and having a second clock source requirement different from the first clock source requirement, wherein the second circuit module receives the second clock signal,
    wherein the first and second PLLs are located at respective first and second routing distances from the first input port, wherein the first and second routing distances are less than respective first and second predetermined maximum routing distances such that the first and second clock source requirements are met,
    wherein the first and second clock source requirements each include at least one of a frequency, jitter, voltage swing, and duty cycle requirement of the first and second circuit modules respectively,
    a second input port that receives the first external reference clock signal;
    a third PLL, connected to the second input port and having a third clock source specification, that receives the first external reference clock signal by way of the second input port and generates a third clock signal; and
    a third circuit module, connected to the third PLL and having a third clock source requirement different from the first and second clock source requirements, that receives the third clock signal, wherein the third PLL is located at a third routing distance from the second input port, and wherein the third routing distance is less than a third predetermined maximum routing distance, such that the third clock source requirement is met, and wherein the third clock source requirement includes at least one of a frequency requirement, a jitter requirement, a voltage swing requirement, and a duty cycle requirement of the third circuit module, and wherein a routing distance between the first input port and the third PLL is greater than the third predetermined maximum routing distance.

2. The integrated circuit of claim 1, wherein the first external reference clock signal is routed to the second input port by way of a clock signal path that is external to the integrated circuit.

3. The integrated circuit of claim 1, wherein the first, second, and third PLLs each comprise at least one of an integer PLL, a fractional PLL, and an IP specific PLL.

4. The integrated circuit of claim 1, wherein the predetermined maximum routing distance is a function of at least one of a jitter specification of the first PLL, a jitter specification of the second PLL, and a jitter specification of the third PLL.

5. The integrated circuit of claim 1, wherein the first external reference clock signal is a single-ended clock signal.

6. The integrated circuit of claim 1, further comprising first and second low-voltage differential signaling (LVDS) receivers, connected between the first input port and the first and second PLLs, respectively, that receive the first external reference clock signal and generate first and second single-ended clock signals, respectively, wherein the first external reference clock signal is a differential clock signal.

7. The integrated circuit of claim 6, further comprising:
    a clock scaler circuit, connected to the first LVDS receiver, that receives the first single-ended clock signal and generates a scaled clock signal;
    a third PLL, connected to the clock scaler circuit and having a third clock source specification, that is located at a third routing distance from the first input port, such that the third routing distance is less than a third predetermined maximum routing distance, and that receives the scaled clock signal and generates a third clock signal; and
    a third circuit module, connected to the third PLL and having a third clock source requirement different from the first and second clock source requirements, and that receives the third clock signal, such that the third clock source requirement is met.

8. The integrated circuit of claim 1, further comprising:
    a second input port that receives a second external reference clock signal that has a first duty cycle;
    a duty cycle re-shaper, connected to the second input port, wherein the duty cycle re-shaper is a third routing distance from the second input port, that receives the second external reference clock signal and generates a third clock signal that has a second duty cycle; and a third circuit module having a third clock source requirement different from the first and second clock source requirements, wherein the third circuit module receives the third clock signal such that the third clock source requirement is met.

9. An integrated circuit, comprising:

a first input port that receives a first external differential reference clock signal;

first and second low-voltage differential signaling (LVDS) receivers, connected to the first input port for receiving the first external differential reference clock signal and generating respective first and second single-ended clock signals;

a first PLL, connected to the first LVDS receiver and having a first clock source specification, and that receives the first single-ended clock signal and generates a first clock signal;

a second PLL connected to the second LVDS receiver and having a second clock source specification, and that receives the second single-ended clock signal and generates a second clock signal;

a first circuit module, connected to the first PLL and having the first clock source requirement, and that receives the first clock signal;

a second circuit module connected to the second PLL and having the second clock source requirement different from the first clock source requirement, and that receives the second clock signal, wherein the first and second PLLs are at first and second routing distances from the first input port, respectively, and wherein the first and second routing distances are less than first and second predetermined maximum routing distances, respectively, such that the first and second clock source requirements are met;

a second input port that receives the first external differential reference clock signal;

a third PLL, connected to the second input port and having a third clock source specification, and that receives the first external differential reference clock signal and generates a third clock signal;

a third circuit module, connected to the third PLL and having a third clock source requirement different from the first and second clock source requirements, and that receives the third clock signal, wherein the third PLL is at a third routing distance from the second input port, and wherein the third routing distance is less than a third predetermined maximum routing distance such that the third clock source requirement is met, and wherein a routing distance between the first input port and the third PLL is greater than the third predetermined maximum routing distance;

a third input port that receives a second external reference clock signal, wherein the second external reference clock signal has a first duty cycle;

a duty cycle re-shaper, connected to the third input port, that is at a fourth routing distance from the third input port, receives the second external reference clock signal and generates a fourth clock signal, wherein the fourth clock signal has a second duty cycle; and a fourth circuit module, having a fourth clock source requirement different from the first, second, and third clock source requirements, that receives the fourth clock signal, such that the fourth clock source requirement is met, and wherein the first, second, third, and fourth clock source requirements each include at least one of a frequency, jitter, voltage swing, and duty cycle requirement of the first, second, third, and fourth circuit modules, respectively.

10. The integrated circuit of claim 9, wherein the first external differential reference clock signal is routed to the second input port by way of a clock signal path that is external to the integrated circuit.

11. The integrated circuit of claim 9, wherein the first, second, and third PLLs each comprise at least one of an integer PLL, a fractional PLL, and an IP specific PLL.

12. The integrated circuit of claim 9, further comprising:

a clock scaler circuit, connected to the first LVDS receiver, that receives the first single-ended clock signal and generates a scaled clock signal;

a fourth PLL, connected to the clock scaler circuit and having a fourth clock source specification, that is at a fifth routing distance from the first input port that is less than a fourth predetermined maximum routing distance, and that receives the scaled clock signal and generates a fifth clock signal; and a fifth circuit module, connected to the fourth PLL and having a fifth clock source requirement different from the first, second, third, and fourth clock source requirements, and that receives the fifth clock signal, such that the fifth clock source requirement is met.

13. A method for designing an integrated circuit (IC) that has a plurality of clock sources that receive an external clock signal from a common input port, the method comprising:

identifying a plurality of clock sources required by respective circuit modules of the IC using an electronic design automation (EDA) tool that includes a memory for storing an initial IC design and a processor in communication with the memory, wherein the plurality of clock sources have a corresponding plurality of clock source specifications;

defining an input port of the IC to be used as a common clock input port;

placing the plurality of clock sources in the initial design such that respective routing distances between the input port and the clock sources is less than respective predetermined maximum routing distances so that at least one of a frequency, jitter, voltage swing, and duty cycle requirement is met;

connecting the placed, clock sources to the common input port and to respective ones of the circuit modules; and placing at least one of a clock scaler circuit and a duty cycle re-shaper between the input port and at least one of the clock sources.

* * * * *